United States Patent [19]

Heddes

[11] Patent Number: 5,450,351
[45] Date of Patent: Sep. 12, 1995

[54] CONTENT ADDRESSABLE MEMORY IMPLEMENTATION WITH RANDOM ACCESS MEMORY

[75] Inventor: Mattheus C. A. Heddes, Kilchberg, Switzerland

[73] Assignee: International Business Machines Corporation, Armonk, N.Y.

[21] Appl. No.: 154,765

[22] Filed: Nov. 19, 1993

[51] Int. Cl.6 ............................................. G11C 15/00
[52] U.S. Cl. ..................... 365/49; 365/230.02; 365/189.07
[58] Field of Search ............ 365/49, 200, 201, 189.07; 371/213

[56] References Cited

U.S. PATENT DOCUMENTS

| | | | |
|---|---|---|---|
| 4,945,512 | 7/1990 | Dekarske et al. | 365/49 |
| 5,010,516 | 4/1991 | Oates | 365/49 |
| 5,072,422 | 12/1991 | Rachels | 365/49 |
| 5,107,501 | 4/1992 | Zorian | 371/213 |

FOREIGN PATENT DOCUMENTS 44300400  11/1984  European Pat. Off. .
0228917   12/1986  European Pat. Off. .
913046777  5/1991  European Pat. Off. .

AU890460  10/1989  WIPO .

OTHER PUBLICATIONS

"Bit Mask Generator," IBM TDB, vol. 30, No. 12, May 1988 pp. 320–323.

T. B. Pei et al. "VSLI Implementation of Routing Tables:Tries and Cams" IEEE Computer and Communication Societies, N.Y. 1991, 0515–0524, Proceedings of 10th Annual Joint Conference.

European Search Report, The Hague, Jul. 27, 1993, 2 pages.

*Primary Examiner*—Viet Q. Nguyen
*Attorney, Agent, or Firm*—Louis J. Percello

[57] ABSTRACT

A content addressable memory (CAM) implementation using random access memory (RAM) and a method for operating the implementation are described, wherein the RAM is divided into smaller, individually addressable units, which are addressed by a subword of the applied keyword, and the outputs of which are bitwise ANDed. The result of the bitwise AND operation is used to activate the matching lines of the CAM implementation. The new implementation allows the use of conventional circuit design.

9 Claims, 5 Drawing Sheets

CONTENT ADDRESSABLE MEMORY IMPLEMENTATION WITH RANDOM ACCESS MEMORY

FIELD OF THE INVENTION

The present invention relates to an implementation of a content addressable memory (CAM) for a W-bit keyword and N possible matching addresses by using a random access memory (RAM) and the input keyword to address the memory locations of said RAM. It further relates to methods for operating said implementation, including the use as a specific type of CAM known as functional memory (FM). The term implementation is defined as the realization of a system design in hardware, software, or both.

BACKGROUND OF THE INVENTION

In the field of computer techniques basically two different types of memories are found with regard to the access to stored data.

In case of the first type, the stored data are read by addressing a memory location within the memory by its number. Usually, such a memory chip shows separate address lines and data lines. To search data from such a memory, the exact address of this data has to be known. The addressed, stored data is then connected to the data lines. To this category of storage devices belong the random access memory (RAM) and the read only memory (ROM). Though this storage principle became common and appears nowadays in virtually every complex electronic device, the random access presents only a limited solution to the access requirements of many problems involving large amounts of data or fast access to certain data sets. For many applications, therefore, a name or object oriented approach to a memory location appears to be advantageous.

This storage principle is represented by the content addressable memories (CAM), also known as associative memories. These memories are labeled content or data driven, as they make use of the input word (keyword) to find all the information associated with that key. In general, the result of the input of an keyword is a match or coincidence indication of some stored words. The match or coincidence indication appears as activation of a matching line used for subsequent operations.

Content addressed devices allow to perform a search after a keyword in a parallel mode, in which all stored words are compared with the keyword simultaneously. Therefore, the use of CAM gives in many applications (except purely numerical) a significant gain in speed, which has to be paid on the other hand by higher costs per bit.

A special implementation of a CAM is known as functional memory (FM). The functional memory allows to set single bits of a stored word into a "don't-care" state being irrelevant to the matching or coincidence function. The bits of a word stored in a FM can, thus, take a third state, besides the logical 0 and 1. In conventional FM designs, the don't-care state is, for example, implemented by using flip-flops blocking the access to certain bits.

If the matching lines are not designed to address any following devices directly, often priority encoders follow to handle multiple matches. This is done by ordering the matches into a sequence according to a priority scheme.

CAMs have found many fields of application including protocol processing units in information networks, where a packet of data includes an address, which is used as the keyword for the CAM. The CAM, then, indicates the address to which the data are to be directed. Other applications are found in parallel processing to manage access to storage devices and processors common to all units. Further fields of application are data or demand driven computer architectures, and database engines, specially designed to handle the access to databases.

Since CAMs do have the above mentioned advantages, numerous ways of implementation have been suggested. Usually, the CAM implementation by semiconducting devices requires a special chip design resulting in a higher number of transistors per bit and a higher number of pins compared to the standard RAM devices. An advanced example of this approach is described in EP-A-0183885. However, in many cases the special design of the CAMs prevents their use in otherwise conventionally designed circuits, like programmable gate arrays.

A closer definition of the technical field of the invention is provided by the efforts to implement CAM using conventional random access memory. Examples for these methods or the resulting devices, respectively, may be found in EP-A-0228917, EP-A-0459703, or in the international application WO 90/04849. The underlying principle of these known techniques is a sequential comparison of the keyword with the stored data. The sequential comparison, however, deteriorates the speed of search, i.e. the main advantage of the content addressable memory. Therefore, the current invention does not make use of a sequential comparison of the stored words with the keyword, but is instead based on directly addressing the memory location at which an appropriate destination is stored by at least a part of the keyword. This technique, described for example by T.-B. Pei et al., IEEE INFOCOM 1991. Proceedings of the 10th Annual Joint Conference of the IEEE Computer and Communication Societies, New York, 1991,0515–0524, is appropriate due to its speed and simplicity only if the width of a keyword is small. As modern applications often demand keywords having a data width of 16 bits and more, this simple approach is no longer feasible.

OBJECTS OF THE INVENTION

It is, therefore, an object of the invention to provide a method for implementing CAM with RAMs.

More specifically, it is an object of the invention to introduce a CAM implementation with high search speed and to overcome the address space limitation of known approaches.

SUMMARY OF THE INVENTION

To implement a content addressable memory (CAM) with an input word size or keyword width of W bits and N output lines according to the invention, m subsets of the keyword are used to address m random access memories (RAMs). The subsets of the keyword preferably have a width of W/m bits. Each RAM has an output data width of N bits corresponding to the N output lines of the conventional CAM. The RAMs may be of the static (SRAM) or dynamic (DRAM) type. The DRAMs, e.g. video RAM, have the advantage of a smaller number of transistors per memory cell and are preferred to be used with the new implementation, if production costs are considered to be most important. The use of SRAMs gives, on the other hand, the advantage of a higher operating speed. After being addressed, these RAMs connect the data stored at the addressed location to the output lines. The m output data are subjected to a boolean AND operation, in which the i-th bit of one output is ANDed with the i-th bit of all others, i being a number between 0 and $N-1$. This operation is shortly denoted as a bitwise AND. Devices to perform the described operation are known as (bitwise) AND gates. The bitwise AND results in a word of N-bit width having a logical 1 as bit i, only, if all bits i of the m outputs show a 1. The data as stored in the m RAMs secure that a 1 appears at the output line which is assigned to the applied keyword corresponding to the working principles of a known CAM as set out at the beginning of this description. Though being only pad of the stored data, a 1 within the output of the AND operation leads to the activation of a matching line undistinguishable from the the way a regular CAM works. In case that the output word contains more than a single 1, corresponding to a multiple match of the CAM, the matching lines can be fed to a priority encoder. Priority encoder schemes are known to a person skilled in the art. For the sake of shortness, the new implementation according to the invention is defined as RCAM.

To generate a match at bit i when applying a certain keyword, therefore, a 1 at each bit i of the m memory locations addressed by the m subsets of keyword has to be stored beforehand. If this word space to be managed by the RCAM, i.e. the data stored within the m RAMs, remains unchanged during application, the use of read only memories (ROMs) in all their variety (EPROM, EEPROM, etc.) is feasible. The term memory unit comprises both types of memory.

However, a preferred embodiment of the invention allows a flexible management of the word space of the RCAM: To secure that an input keyword gives a match with a line i at the output, this keyword is applied to the address input of the RAMs and an N bit data word with a 1 as i-th bit is stored at each RAM. The setting of a bit can be done in a read-modify-write cycle, in which the previously stored data is read and updated appropriately by, for example, being connected with an OR operation to another data word which in turn has only the i-th bit set to 1. A more convenient way is to use known bit-addressable RAMs for the implementation. Growable bit-addressable memories and registers being based, for example, on the techniques described in: J. Petrovick Jr. et al., "A 300k-Circuit ASIC Logic Family",Proc. of ISSCC '90, 88–89 (1990), are applied with advantage. The writing procedure described above is only used for an empty RAM, which contains only zeros. To introduce changes in the stored data, the procedure has to be modified. To change the keyword leading to a match at line i, first the old keyword has to be applied 'to the address input and the i-th bit has to be cleared. When the bit has been cleared, the new keyword can be applied in the same manner as described above. This embodiment of the invention includes the application of a memory (control RAM), which serves as storage for the keywords and the bit position(s) to which they match. A preferred method is to store the keyword at a memory location of the control RAM addressed by the correspondent matching line index i. Using this embodiment of the invention, new keywords can be applied to old matching addresses and vice versa resulting in an broader applicability of the new method.

Another preferred embodiment of the invention is an implementation of a functional memory (FM). As described above, a functional memory is basically a CAM in which the bits of the stored words can be put into one of three states. The first two are 1 and 0 for the matching with the input key, and the third state is a "don't-care", indicating that said bit is to be ignored in the matching process.

According to the invention a don't-care bit is implemented by an extension of the bit setting procedure, as described above for the RCAM. To activate a certain line mi without regard to the k-th bit of the keyword, the k-th bit of the key is set during the writing of the word space once to 1 and once to 0. This generates two different addresses to one of the RAMs. At both memory locations, the i-th bit is set to 1. During the operation of the FM, thus, a match at the i-th bit or matching line $m_i$ is established, irrespective of the k-th bit of the input keyword. In general, this implementation requires $2^n$ storing or writing operations for n don't-care bits in one word. Controlling the change of the stored words, further, requires two bits to store one bit of word complying to the three possible states. Thus, the control RAM is provided with a word width of 2N to control a FM with a word width of N bits. The control RAM becomes superfluous if no change of the word space has to be dealt with in a specific implementation. In this case, the writing procedure can be shortened by loading a precalculated content into the RAMs.

The new implementation advantageously allows to increase the number of stored words by using additional, separately controllable address lines of the RAMs, which are not connected to the subset of the keyword. For example, during the start of an associative read, the additional address lines are set to zero. If no match has been found, the additional address is incremented and the matching procedure is repeated. The search is stopped when encountering a match or when all address lines are set to 1. The latter condition may also be valid, if multiple matches are allowed by the following devices. By using n additional address lines the number of words stored in the RCAM is increased by a factor $2^n$.

The additional address lines of the RAMs may also serve as a implementation of a mask for the input keyword. Such a mask is used in known CAMs to suppress certain bits of the keyword in the whole matching process in contrast to a FM. To implement such a mask in accordance with the invention, an additional address line is used for every address line, which connects the keyword to the RAM. If by a proper writing procedure the word space addressed by the additional lines is completely loaded with 1, a bit of the keyword can be masked by switching from the address line connected with the keyword to its counterpad.

Another preferred embodiment of the invention allows to increase the word width, i.e. the number of bits per keyword, by using additional separately controllable address lines and a register. It shows definite advantages, when the keyword is fed to the RCAM not as whole but in sequential blocks.

The input of the first part or block of the keywords results in an N-bit word at the output in the same manner as described above. But instead of being directed to the output lines, it is stored in said register. In the next cycle, the additional address is increased by 1 and the following block of the keyword connected to the input of the RCAM. The resulting N-bit data output is bitwise ANDed with the word previously stored in the register. The result is again clocked into the register. This procedure is repeated until the last block of the keyword is applied to the RCAM. In this last cycle, the output word is finally appearing at the matching lines. Thus, a 1 at the i-th bit of the output represents a 1 at the i-th bit of all preceding outputs stored intermediately in the register. As it is convenient to feed back constantly the data stored in the register, it becomes necessary to set all bits of the register to 1 before operating the device.

It is obvious to a person skilled in the art that a combination of all described embodiments can be implemented readily.

LIST OF THE DRAWINGS

The invention is described below by way of example with reference to the drawings, which are schematic and not drawn to scale. They only show the basic devices whereas standard peripheral components are being left out for the sake of simplicity.

FIG. 1 (prior art) shows the working principle of a CAM.

FIG. 2 sketches the basic elements of the CAM implementation according to the invention and the data flow through them.

DETAILED DESCRIPTION OF THE INVENTION

In the following, the invention is described in detail with reference to the drawings and the prior ad. The addresses of the memory locations of the shown random access memories correspond to the number of the rows when counted from above. Bit-addressable RAMs have been used throughout.

Figure 1:
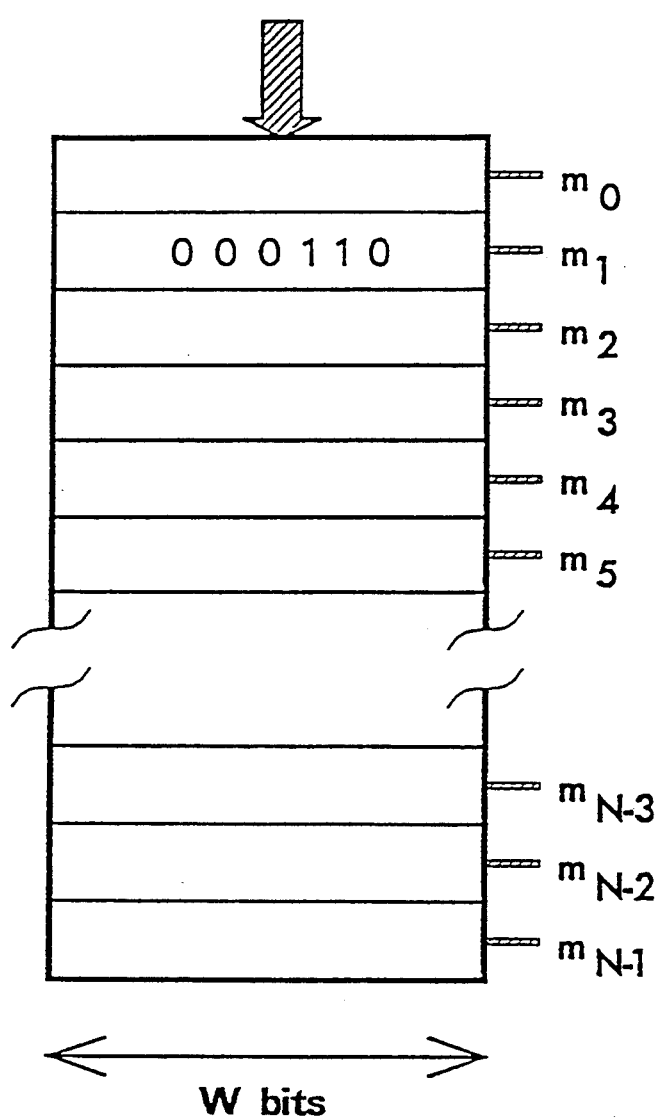

The known concept of a CAM is shown in FIG. 1. The keyword is fed into the CAM, which activates a matching line, when a match is encountered at a memory location (row). Activation usually consists of applying a 1 to a particular output line of the device. The key and the stored data have a width of W bits with W being 6 for the described example. The number of matching lines $m_0$ to $m_{N-1}$ is N. It is assumed that 000110 is stored at row 1. Consequently, a 000110 key input results in an activation of line $m_1$.

The implementation of such a CAM according to the invention (FIG. 2) is based on using three known bit-addressable RAMs with a 4×N-bit capacity. Thus, four words of N-bit width can be stored. In the following, word and row are used as synonyms. Additional address and control lines have been omitted for the sake of simplicity.

In the RAMs, words are stored in such a way that a 1 occurs at the first row of the first RAM, a 1 occurs at the second row of the second RAM, and a third 1 occurs at the third row of the third RAM. The keyword is divided into three subsets of two bits, respectively, by an appropriate division of the keyword input lines. The subsets are applied to the address lines of the RAMs, potentially addressing four rows of the particular memory. The addressed data are applied to the output lines of three RAMs, respectively. The three sets of output data are bitwise ANDed the following gate. The AND operation, thus, results in a N-bit word with a 1 at the bit position where all input data sets (which are the output of the preceding RAMs) show a 1, too.

Figure 2:
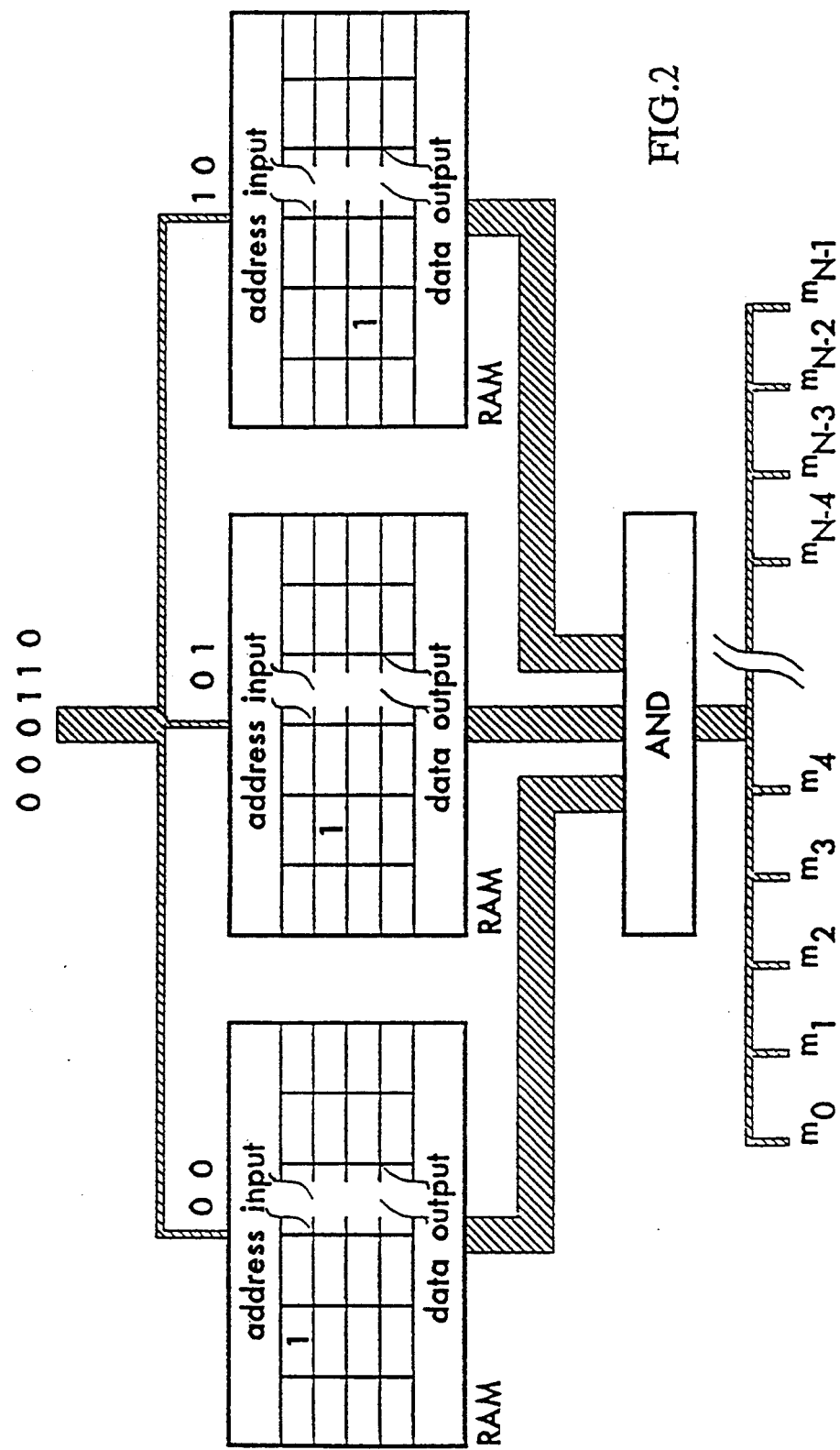

In the example, the keyword 000110 is applied to the RCAM. The subsets of the keyword are 00, 01, and 10, respectively. In FIG. 2 the split data lines are denoted by these subsets. As the first subset of the keyword addresses the first row of the first RAM, a 1 is found as second bit of the data output. The same applies to the second and third RAM, which were addressed by 01 and 10, respectively. The following AND operation results in a N-bit word with 1 as second bit corresponding to an activation of matching line $m_1$, as desired.

Figure 3:
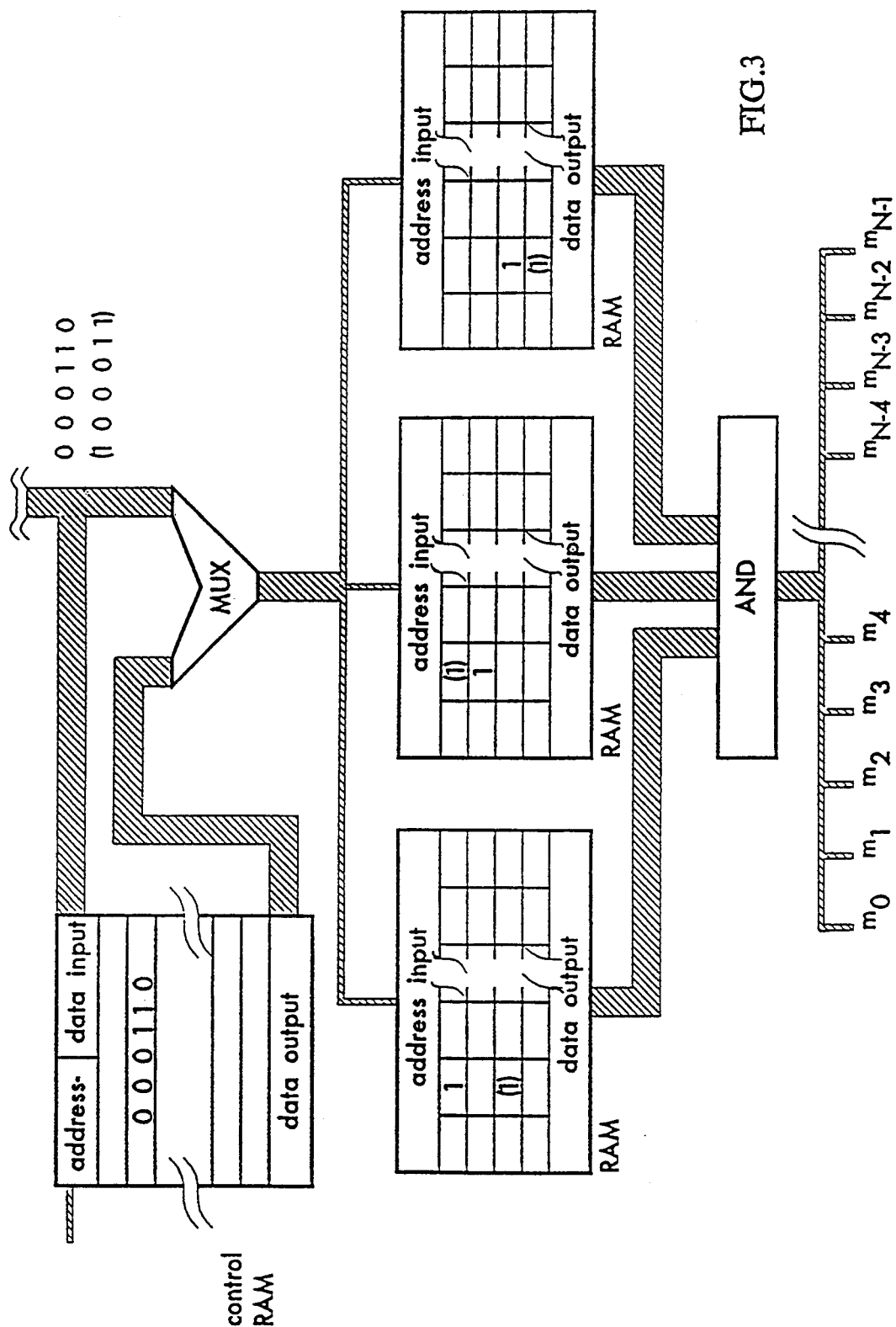
FIG. 3 shows the use of an additional control RAM.

In the second example of the invention (FIG. 3), the RCAM has been extended for changing the data stored in the RAMs and, consequently, the matching line. The extension consists essentially of a fourth RAM acting as control RAM. This control RAM stores the keyword to a certain matching line at the address corresponding to this matching line. Row number and the stored keyword is used to set the bits within the three RAM. To change the keyword activating matching line $m_1$ from 6 (binary: 000110) to 35 (100011), the matching line number (1) was used to address the control RAM, which, in turn, outputs the old keyword (000110). This word is fed to the address input of the three RAMs via a multiplexer (MUX). The MUX serves as switch between the data coming from the control RAM and the keywords applied during normal operation. The output of all three RAMs is connected to a logic unit (not shown), which clears the second bit each output and restores the remainder. In a following step, 100011 is used to address the three RAMs and the second bit of each output data is updated to 1 and restored in the same way as described above. FIG. 3 shows the the memories in the old and new state, with the latter denoted by brackets. After storing the new data, a 100011, applied as keyword, activates the matching line $m_1$.

Figure 4:
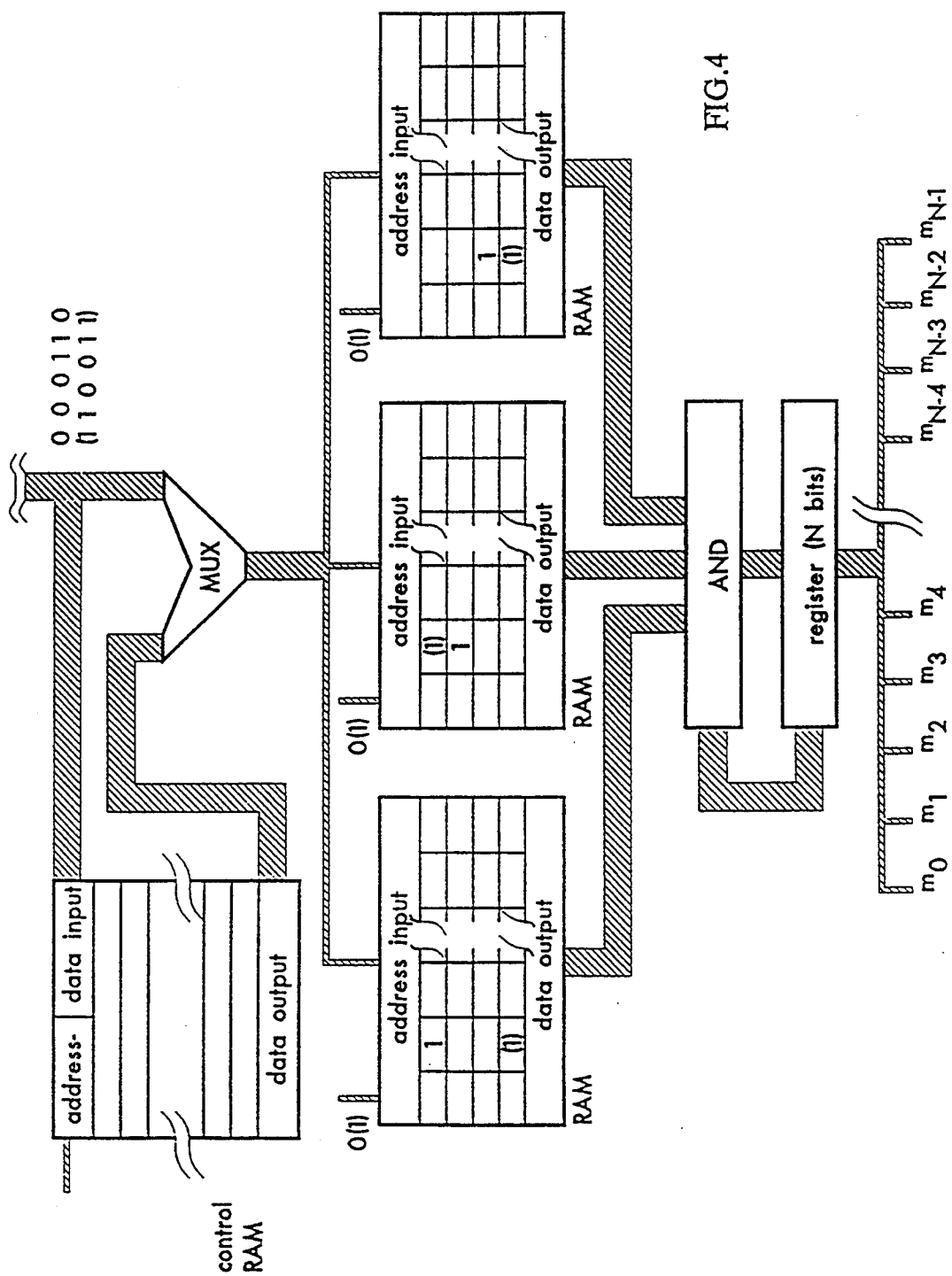
FIG. 4 shows the use of a register to increase the effective bit size of the keyword.

In a third example of the invention, an N-bit register is added to the RCAM, the contents of which is fed back to the AND unit (FIG. 4). Initially, all bits of the register are set to 1. FIG. 4 also shows an additional address line to the RAMs used. The data stored at locations related to a 1 at this address line are put into brackets. Thus, the RAMs shown depict two RAM locations: one at which the data in brackets are stored and one at which the data without brackets are stored. A twelve-bit keyword (000110110011) is connected to the modified RCAM in subsequent portions of 6 bits each. The second portion of the keyword is set into brackets. The first output from the RAM, which are additionally addressed by 0, has a 1 as the second bit. The bitwise ANDing with the content of the register does not lead to a change as it was preloaded with 1 at all bit positions. The N-bit output, having a 1 only as the second bit, is stored in the register and subsequently, the second half of the keyword addresses the RAMs. Simultaneously, the additional address line is switched to 1 giving access to the memory contents in brackets. Again a 1 at the second bit of all three outputs occurs. Bitwise ANDing with the contents of the register provides no change, as the register contained a 1 as second bit from its previous loading. After this, the output is connected to the matching lines activating $m_1$.

Figure 5:
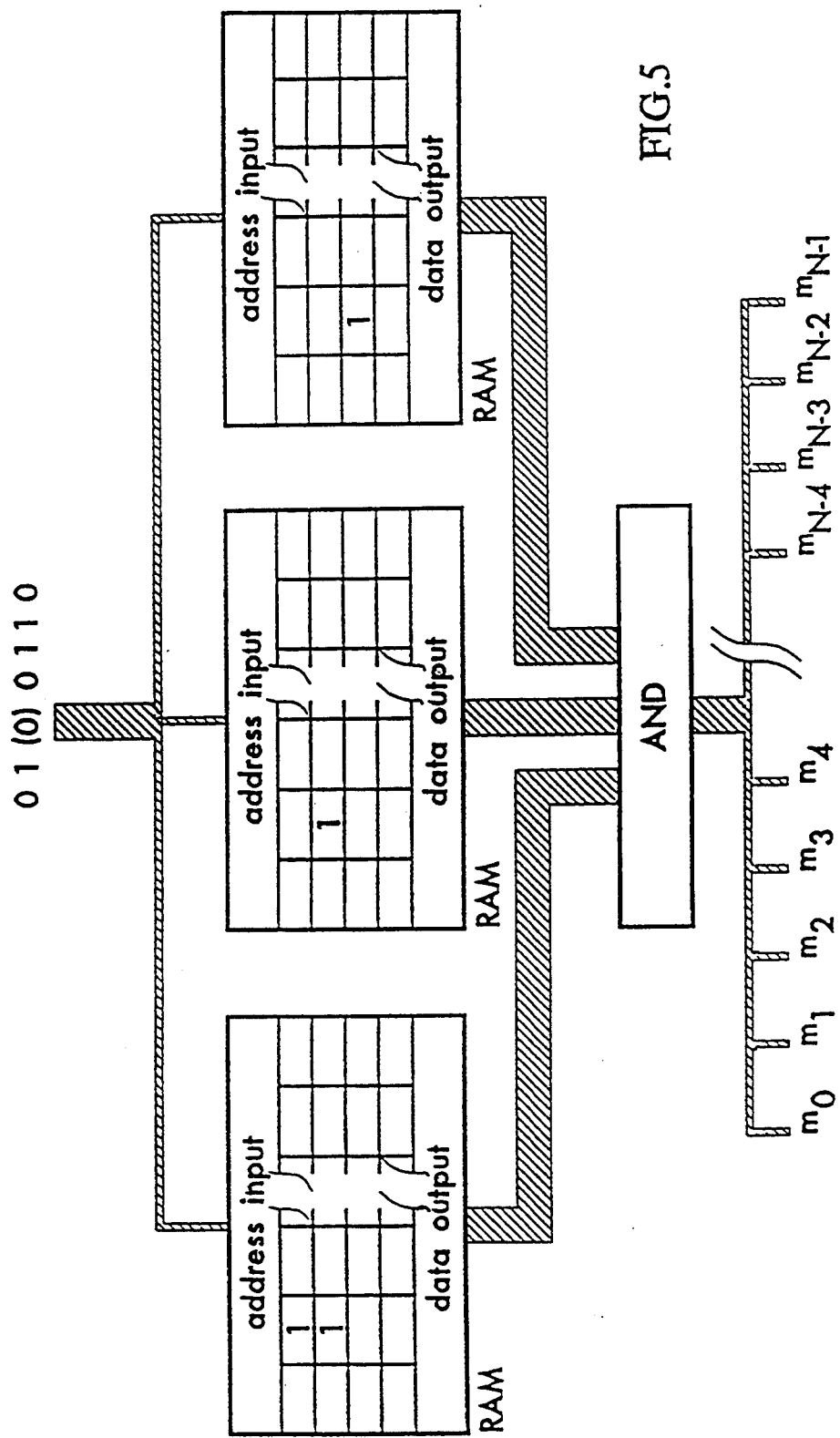
FIG. 5 shows the implementation of a functional memory.

In a fourth example (FIG. 5), the implementation is used as functional memory (FM). As said above, the FM is basically a CAM, which allows to set single bits in the word space into a don't-care state. With regard to FIG. 1 it is assumed that the second bit of the stored word 000110, leading to $m_1$, should be set into the don't-care state, i.e. line $m_1$ is activated without regard to the second bit of the keyword. In other terms, applying 000110 or 010110 both end in a match at $m_1$.

To implement a functional memory device, the basic structure shown in FIG. 2 is used, together with a modification of writing to the word space of the memories: First the addressing key 010110 is applied, and the second bit of the second word (row) of the first memory is set to 1. In a second writing step, the memories is addressed by 000110, and the second bit the first word (row) of the first memory is set to 1. The writing to the other memories does not change with regard to the first two examples of the invention, as described above. In operation, any keyword of the bit structure $0 \times 0110$ (x=0,1) activates matching line $m_1$, i.e. this special implementation acts as functional memory.

I claim:

1. A content addressable memory (CAM) implementation for a W bit wide keyword, applied to a set of input lines, and a set of N possible matching lines with a random access memory (RAM) addressable by said keyword, wherein said RAM consists of m individually addressable memory units each having an N-bit wide output, address lines of each of said m memory units are connected to a subset of the input lines for the keyword, and the outputs of said m memory units are connected to a gate performing a bitwise AND operation, the output of which serves to activate a subset of said N possible matching lines.

2. The CAM implementation in accordance with claim 1, further comprising a control RAM connected to the address lines of said m memory units to store keywords and information related to the subset of the matching lines addressed by the keyword.

3. The CAM implementation in accordance with claim 1, further comprising a register connected by a feedback loop to the AND gate.

4. A content addressable memory in accordance with any of the claims 1 to 3 that is used as a functional memory.

5. A method for operating a content addressable memory (CAM) implementation for a W-bit wide keyword and a set of N possible matching lines, said implementation comprising of m individually addressable memory units and a gate bitwise ANDing the data outputs of said m memory units, wherein the m memory units are loaded with a 1 at a position determined by the matching line assigned to the addressing keyword; the keyword is divided into m subwords, each subword is used to address each of said m memory units, and the data outputs of said m memory units are bitwise ANDed resulting in an N-bit output word used to activate a matching line assigned to the keyword applied.

6. A method in accordance with claim 5, wherein a keyword which activates a matching line is stored in a control RAM at a location the address of which is related to said matching line, and said control RAM is used to address the stored data in the m memory units to modify the matching line assigned to the keyword.

7. A method in accordance with claim 5 or 6, wherein additional address lines are used on at least one of the m memory units to create an expanded m memory unit, the additional address lines not connected to the subword of the keyword and the additional address lines enabling addressing of additional words in the expanded m memory unit.

8. A method in accordance with claim 5, wherein the admissible bit width of an input keyword is increased by dividing said input keyword into W-bit wide portions, applying said portions sequentially as partial keywords, resulting in sequential N-bit wide outputs of the m memory units, bitwise ANDing the m N-bit wide outputs addressed by a single partial keyword, storing the result of said bitwise ANDing in an intermediate register, and feeding the contents of said register back to the AND gate and ANDing it with the following m N-bit wide outputs until the last portion of said input keyword has been applied, and using the result of the last AND operation to activate the matching line assigned to said input keyword.

9. A method for operating a content addressable memory in accordance with claim 5 as a functional memory.

* * * * *